United States Patent
Lim

(10) Patent No.: US 7,554,478 B2
(45) Date of Patent: Jun. 30, 2009

(54) SINGLE SLOPE ANALOG TO DIGITAL CONVERTER USING HYSTERESIS PROPERTY AND ANALOG TO DIGITAL CONVERTING METHOD

(75) Inventor: Yong Lim, Suwon-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 11/831,144

(22) Filed: Jul. 31, 2007

(65) Prior Publication Data

US 2008/0180298 A1    Jul. 31, 2008

(30) Foreign Application Priority Data

Jan. 29, 2007    (KR) ...................... 10-2007-0009136

(51) Int. Cl.
*H03M 1/56*    (2006.01)

(52) U.S. Cl. ........................................ 341/169; 341/155

(58) Field of Classification Search ................. 341/155, 341/169, 170, 158
See application file for complete search history.

(56) References Cited

U.S. PATENT DOCUMENTS

| | | | | |
|---|---|---|---|---|
| 4,281,317 A | * | 7/1981 | Pace | 341/118 |
| 4,565,919 A | * | 1/1986 | Bitter et al. | 219/509 |
| 4,843,339 A | * | 6/1989 | Burt et al. | 330/10 |
| 5,140,591 A | * | 8/1992 | Palara et al. | 327/109 |
| 5,565,812 A | * | 10/1996 | Soenen | 327/558 |
| 5,995,011 A | * | 11/1999 | Kurihara et al. | 340/663 |
| 6,822,597 B2 | * | 11/2004 | Draxelmayr et al. | 341/155 |
| 6,965,339 B2 | | 11/2005 | Midya et al. | |
| 7,088,279 B2 | * | 8/2006 | Muramatsu et al. | 341/155 |
| 2005/0184762 A1 | | 8/2005 | Yuki et al. | |
| 2006/0001750 A1 | | 1/2006 | Mizuguchi et al. | |
| 2006/0159163 A1 | * | 7/2006 | Kimura et al. | 375/225 |

FOREIGN PATENT DOCUMENTS

| | | |
|---|---|---|
| JP | 2005-269611 | 9/2005 |
| JP | 2006-020171 | 1/2006 |
| KR | 1020060002704 A | 1/2006 |
| KR | 1020060042006 A | 5/2006 |

* cited by examiner

*Primary Examiner*—Peguy JeanPierre
(74) *Attorney, Agent, or Firm*—F. Chau & Assoc., LLC

(57) ABSTRACT

A single slope ADC using a hysteresis property includes a first comparator, a second comparator, and a code generating unit. The first comparator outputs a compared signal by receiving and comparing an input signal having a constant level with a ramp signal, the second comparator has a hysteresis property having an input terminal connected to an output terminal of the first comparator, and the code generating unit is connected to the second comparator and outputs a digital code corresponding to a time-point of a state transition of an output signal of the second comparator. The second comparator can be embodied as a Schmidt trigger or a Schmidt-trigger inverter. The single slope ADC further includes a controller that controls at least one of a rising threshold or a failing threshold of the Schmidt trigger or of the Schmidt-trigger inverter.

13 Claims, 5 Drawing Sheets

SINGLE SLOPE ANALOG TO DIGITAL CONVERTER USING HYSTERESIS PROPERTY AND ANALOG TO DIGITAL CONVERTING METHOD

RELATED APPLICATION

This application claims priority under 35 U.S.C. § 119 to Korean Patent Application No. 10-2007-0009136, filed on Jan. 29, 2007, the disclosure of which is hereby incorporated by reference herein as if set forth in its entirety.

BACKGROUND OF THE INVENTION

1. Technical Field

The present disclosure relates to analog to digital converting technology and, more particularly, to a single slope analog to digital converter using a hysteresis property and an analog to digital converting method.

2. Discussion of Related Art

A single slope analog to digital converter, that is, single slope ADC, receives and compares an input signal having a constant voltage level to a ramp signal, and converts a time or a time-point, when a voltage level of the input signal and a voltage level of the ramp signal become the same, into a digital signal or a digital code.

FIG. 1 is a block diagram of a conventional single slope ADC. The single slope ADC 10 includes a comparator 12, an inverter 14, and a code generator 16.

The code generator 16 can include a counter (not shown). The counter starts counting in response to a clock signal CLK from a time when a ramp signal RAMP starts ramping and outputs an n-bit (n is a natural number) digital value as a result of the counting. Therefore, the code generator 16 outputs the n-bit digital value at a time or time-point, when a voltage level of the input signal INPUT and a voltage level of the ramp signal RAMP become the same, as a digital signal (or a digital code).

FIGS. 2A and 2B illustrate waveforms of an output signal of the comparator 12 of the single slope ADC 10 and an input signal of the code generator 16 illustrated in FIG. 1.

Referring to FIGS. 1, 2A, and 2B, when the comparator 12 compares a voltage level of the input signal INPUT with a voltage level of the ramp signal RAMP, the comparator 12 outputs an output signal that includes noise of the ramp signal RAMP, as well as noise introduced by the comparator 12.

Even if not considering noise generated from the inverter 14, noise of the ramp signal RAMP and noise from the comparator 12 are inputted to the code generator 16 as they are through the inverter 14 and, thus, noise of the ramp signal RAMP and noise from the comparator 12 directly affect a digital code OC outputted from the code generator 16. The digital code OC can be an n bit digital value outputted from a counter.

FIG. 2A illustrates waveforms of an ideal output signal of a comparator 12 or an output signal of a comparator 12, which does not introduce any noise at all, and an input signal of a code generator 16. In this case, the code generator 16 outputs a digital code CODE1 indicating a time or time-point when a voltage level of an input signal INPUT and a voltage level of a ramp signal RAMP become the same.

FIG. 2B illustrates waveforms, however, of an output signal of a comparator 12 including noise and an input signal of a code generator 16 reflecting that noise. In this case, the code generator 16 outputs a digital code CODE2, not digital code CODE1, due to the effect of the noise included in the output signal of the comparator 12. The output code noise is represented by the difference between digital code CODE2 and digital code CODE1.

In other words, the code generator 16 does not exactly convert the time or time-point, when the voltage level of the input signal INPUT and the voltage level of the ramp signal RAMP become the same, as a digital code due to the effect of digital code noise generated on the ground of basis of noise included in an output signal.

In addition, in case that a feature of the comparator 12 cannot be optimized, for example, is not able to eliminate noise, due to a limitation of layout areas in a CMOS image sensor, which includes the single slope ADC 10 illustrated in FIG. 1, has a column parallel structure arranged in several columns, the code generator 16 is affected with the noise introduced by the comparator 12.

Accordingly, since the code generator 16 embodied in the CMOS image sensor cannot exactly convert a time or time-point, when a voltage level of the input signal INPUT and a voltage level of the ramp signal RAMP become the same, as a digital code, a performance of the CMOS image sensor is considerably degraded.

Therefore, for improving the performance of the single slope ADC 10 or CMOS image sensor including such a single slope ADC 10, a single slope ADC that can reduce noise generated by a comparator 12 and inputted to a code generator 16 is strongly required

SUMMARY OF THE INVENTION

Exemplary embodiments of the present invention provide a single slope ADC that reduces noise generated from a comparator and inputted to a noise reducing code generating unit, and a CMOS image sensor that includes the single slope ADC.

According to an exemplary embodiment of the present invention, there is provided a single slope analog to digital converter including a first comparator, a second comparator, and a code generating unit. The first comparator receives and compares an input signal having a constant level with a ramp signal, then outputs the compared signal. The second comparator has a hysteresis property having an input terminal connected to an output terminal of the first comparator. The code generating unit is connected to the output terminal of the second comparator and outputs a digital code corresponding to a time-point of a state transition of the output signal of the second comparator.

The second comparator can be embodied as a Schmidt trigger or a Schmidt-trigger inverter. The single slope analog to digital converter can further include a controller that can control at least one of a rising threshold or a falling threshold of the Schmidt trigger or the Schmidt-trigger inverter.

The code generating unit includes a counter, which outputs a digital count value in response to a clock, and a code generator that outputs the digital count value of a time-point of a state transition of the output signal of the second comparator to the digital code in response to the output signal of the second comparator and the digital count value.

In an exemplary embodiment, the code generating unit can include a counter that outputs a digital count value in response to a clock signal, and a memory that receives the output signal of the second comparator and the digital count value, then latches the digital count value as the state of the output signal of the second comparator changes.

The CMOS image sensor includes the single slope analog to digital converter.

According to exemplary embodiments of the present invention there is provided a single slope analog to digital converting method. The single slope analog to digital converting method includes outputting a first compared signal by receiving and comparing an input signal having a constant level with a ramp signal; outputting a second compared signal by using a hysteresis property by comparing the first compared signal; and receiving a digital count value, which is successively changed, and the second compared signal, then, outputting a digital code corresponding to the digital count value of a time-point of a state transition of the second compared signal.

The step of outputting the second compared signal includes outputting the second compared signal by comparing the first compared signal using a Schmidt trigger or a Schmidt-trigger inverter.

The step of outputting the digital code includes generating the count value in response to a clock signal, and receiving the second compared signal and the digital count value and outputting the digital codes corresponding to the digital count value of a time-point of a state transition of the second compared signal.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
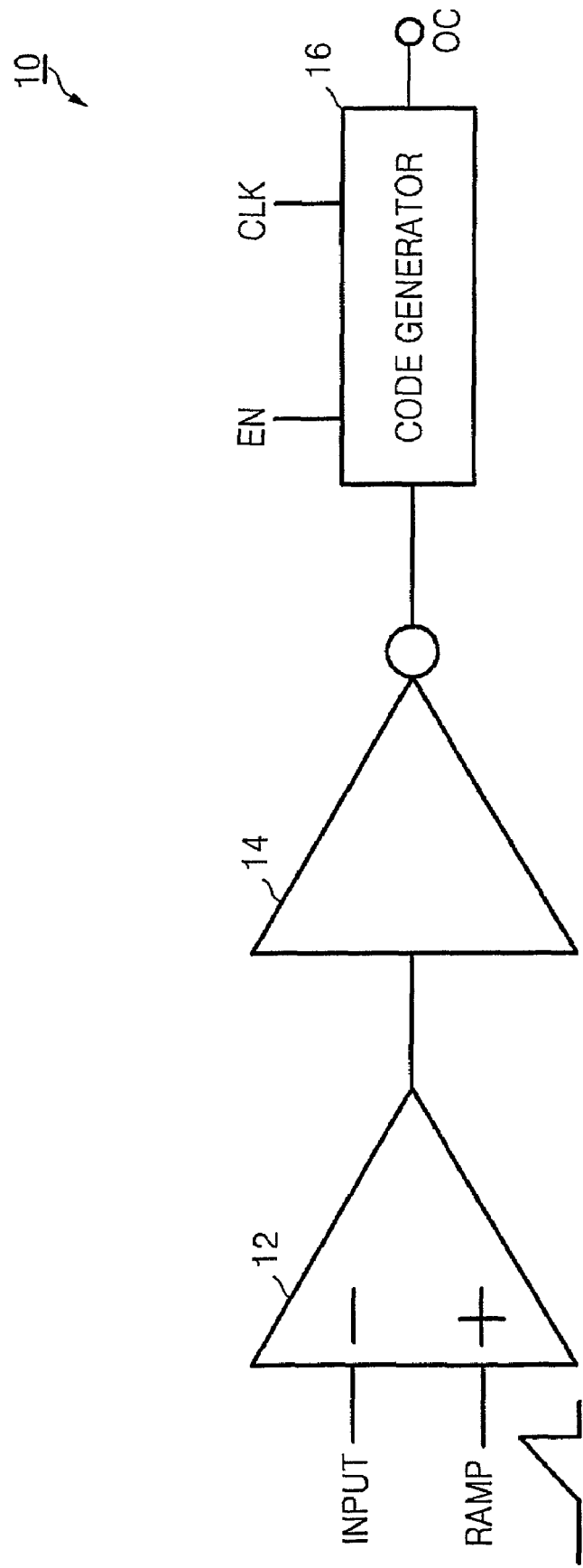
FIG. 1 is a block diagram of a conventional single slope ADC.

The attached drawings illustrate exemplary embodiments of the present invention, and are referred to in order to gain a sufficient understanding of the present invention, the merits thereof, and the objectives accomplished by the implementation of the present invention. Hereinafter, the present invention will be described in detail by explaining exemplary embodiments of the present invention with reference to the attached drawings. Like reference numerals in the drawings denote like elements.

Figure 3:
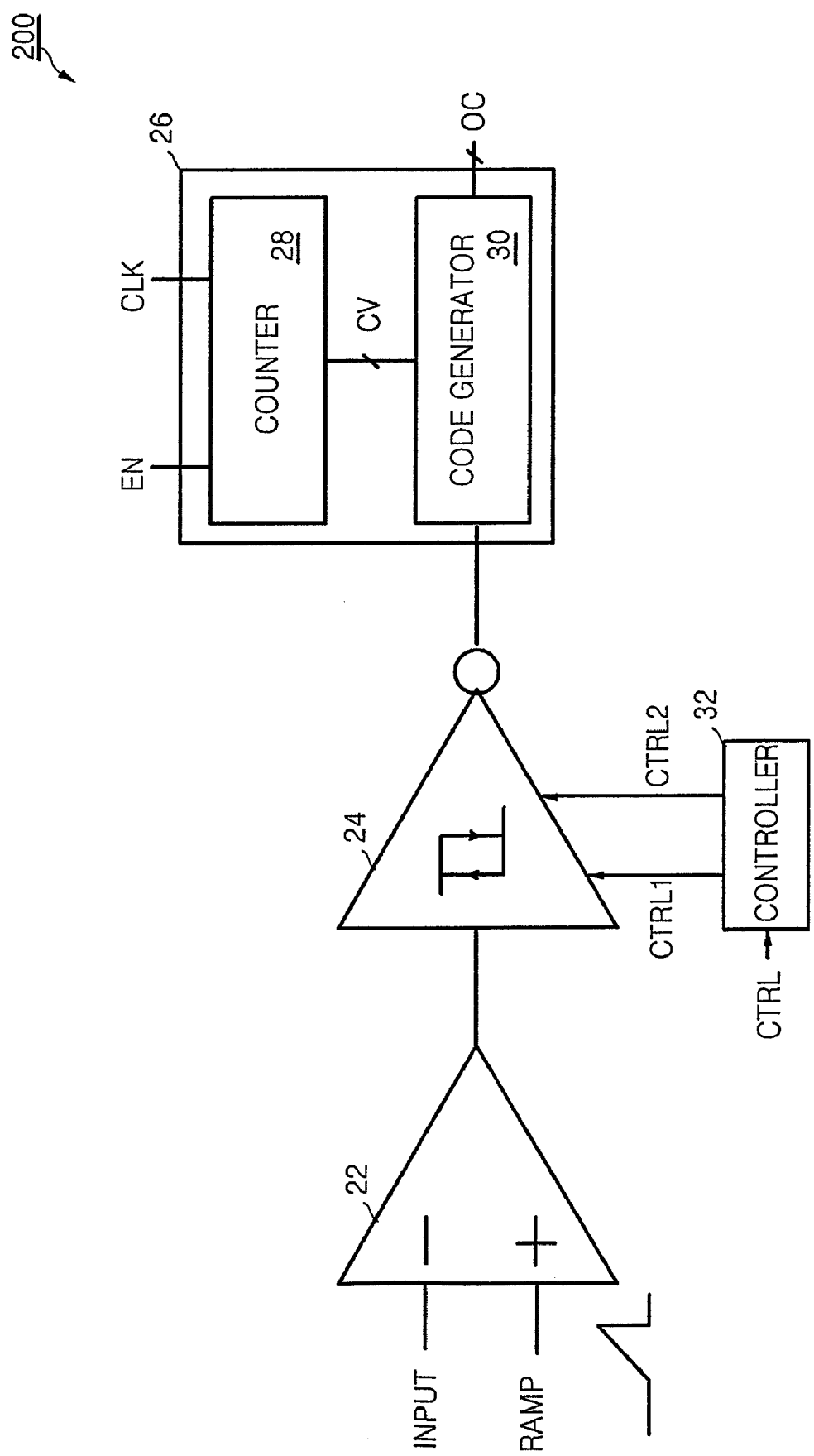
FIG. 3 is a block diagram of a single slope ADC using a hysteresis property according to an exemplary embodiment of the present invention.

FIG. 3 is a block diagram of a single slope ADC using a hysteresis property according to an exemplary embodiment of the present invention. As shown in FIG. 3, the single slope ADC 200 includes a first comparator 22, a second comparator 24, and a code generating unit 26.

The first comparator 22 receives an input signal INPUT, for example, a signal output from a pixel (not shown) of a CMOS image sensor (not shown), having a constant level input to a first input terminal, for example, a (−) input terminal, and a ramp signal RAMP input to a second input terminal, for example, a (+) input terminal, then outputs a comparison result by respectively comparing voltage levels of the received signals INPUT and RAMP. The ramp signal RAMP can be output from a ramp signal generator (not shown).

For example, in the case that a voltage level of the input signal INPUT is higher than that of the ramp signal RAMP, the first comparator 22 outputs an output signal having a first state, for example, a low level. In the case that a voltage level of the input signal INPUT is lower than that of the ramp signal RAMP, the first comparator 22 can output an output signal having a second state, for example, a high level.

According to an exemplary embodiment of the present invention, the input signal INPUT can be input to a (+) input terminal, and the ramp signal RAMP can be input to a (−) input terminal. In addition, for convenience of explanation, the ramp signal RAMP having an upward ramping is illustrated in FIG. 3, however, the ramp signal RAMP can be substituted with a ramp signal having a downward ramping.

The input terminal of the second comparator 24 is connected to the output terminal of the first comparator 22. The second comparator 24 is an example of a comparison circuit having a hysteresis property. Accordingly, the second comparator 24 can be embodied as a Schmidt (Schmitt)-trigger inverter or a Schmidt (Schmitt) trigger.

When the second comparator 24 is embodied as the Schmidt-trigger inverter, in a case that the output signal of the first comparator 22 has a first state, for example, a low level, that is, having a lower level than a rising threshold voltage Vthr, the Schmidt-trigger inverter 24 outputs a signal having a second state, for example, a high level. In the case that the output signal of the first comparator 22 has the second state, that is, having a higher level than a failing threshold voltage Vthf, the Schmidt-trigger inverter 24 can output a signal having the first state.

Figure 4:
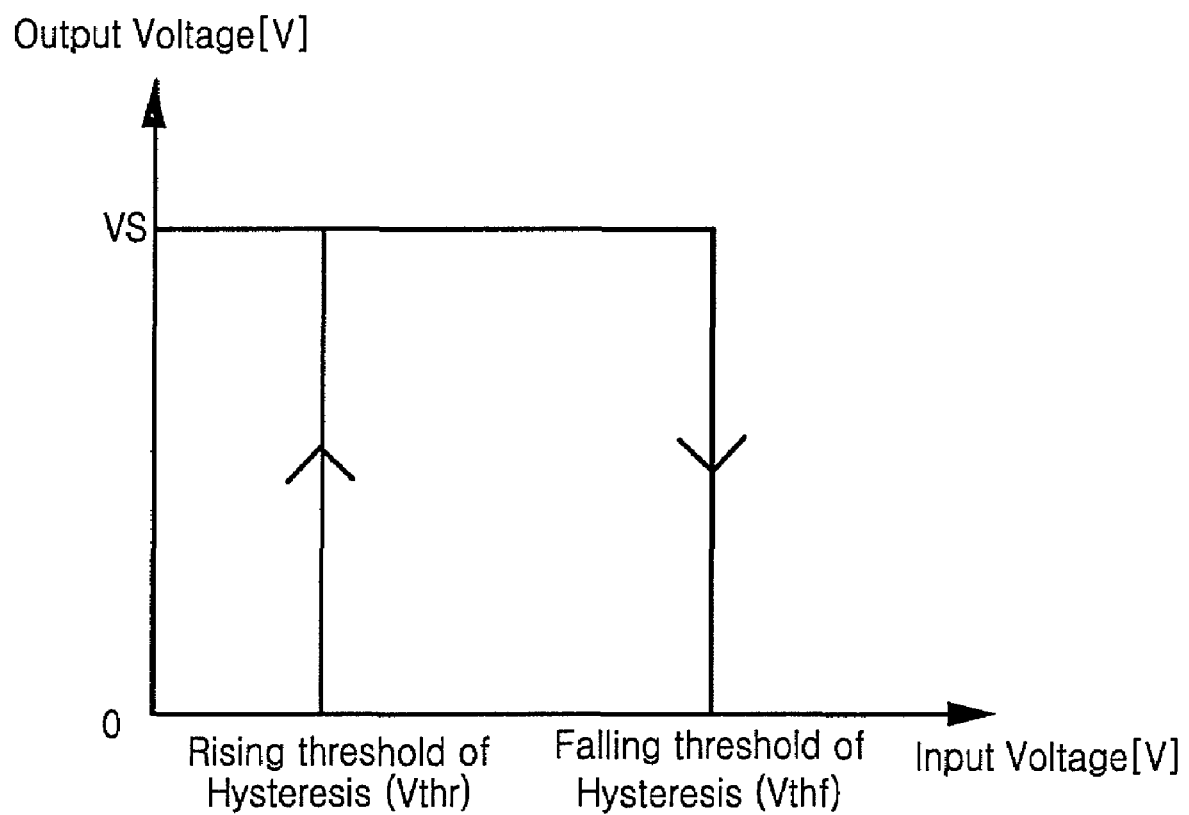
FIG. 4 illustrates an input/output property of hysteresis.

FIG. 4 illustrates an input/output property of hysteresis of the Schmidt-trigger inverter. As shown in FIG. 4, for example, in a case that a lower input voltage than the rising threshold Vthr is input to the Schmidt-trigger inverter 24, the Schmidt-trigger inverter 24 outputs an output signal having a second state, for example, a high level, and then keeps the second state, for example, a high level) until a higher input voltage than the falling threshold Vthf is input.

In addition, when an input voltage higher than the falling threshold Vthf is input to the Schmidt-trigger inverter 24, the output signal of the Schmidt-trigger inverter 24 maintains the first state, for example, a low level until a lower input voltage than a rising threshold Vthr is input after a transition from the second state, for example, a high level, to the first state, for example, a low level. Further, when an input voltage lower than a rising threshold Vthr is re-input to the Schmidt-trigger inverter 24, the output signal of the Schmidt-trigger inverter 24 repeatedly transits from the first state, for example, a low level to the second state, for example, a high level.

Referring to FIG. 3, the code generating unit 26 receives the output signal of the second comparator 24 and the clock signal CLK, and counts a time-point of a state transition of the output signal of the second comparator 24, for example, a transition of from the high level to the low level, or a transition from the low level to the high level, based on a predetermined edge of the clock CLK, that is, any one of a rising edge or a falling edge, and then outputs a digital code OC as a counting result. The digital code OC can be embodied as m bits (m is a natural number).

The code generating unit 26 includes an n-bit (n is a natural number) counter 28 and a code generator 30.

The n-bit counter 28 starts counting in response to the signal clock CLK from when the ramp signal RAMP starts ramping, for example, an upward ramping, and outputs an n-bit count value, for example, a gray code; CV, that is successively changed, for example, is increased as a counting result.

The code generator 30 receives the n-bit count value CV from the counter 28 and the output signal of the second comparator 24, and outputs the n-bit count value CV of a time-point, when a state of an output signal of the second comparator 24 transits, for example, a time-point where the signal goes from a high level to a low level, as digital codes OC.

That is, the code generator 30 receives the n-bit count values CV that are successively changed, for example, increased, and outputs the n-bit count value CV at a time-point when the voltage level of an input signal INPUT and the voltage level of a ramp signal RAMP become the same as a digital code OC. The digital code OC can be the n-bit count value CV, and it also can be a certain digital value corresponding to the n-bit count value CV.

According to exemplary embodiments of the present invention, when the state of the output signal of the second comparator 24 is a second state, for example, a high level, the enabled n-bit counter 28 can output an n-bit count value CV that is successively changed, for example, increased, in response to the clock signal CLK.

Further, when the state of the output signal of the second comparator 24 transits from the second state, for example, a high level, to the first state, for example, a low level, the disenabled n-bit counter 28 stops counting, and can maintain (or latch) the previous n-bit count value until the state of the output signal of the second comparator 24 retransmits from the first state, for example, a low level, to the second state, for example, a high level.

The code generator 30 can be embodied as a volatile memory such as a SRAM. In this case, when the state of the output signal of the second comparator 24 is changed, the code generator 30 can latch the n-bit count value CV output from the n-bit counter 28.

Figure 2A:
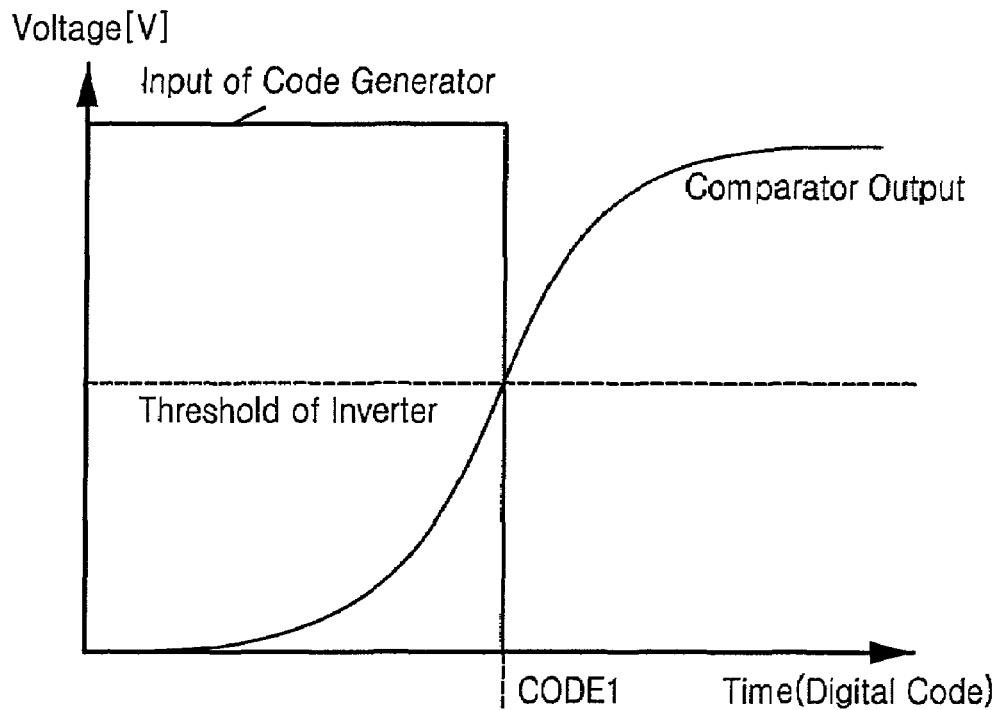
FIG. 2A and FIG. 2B illustrate waveforms of an output signal of a comparator and an input signal of a code generator in the single slope ADC illustrated in FIG. 1.
Figure 5A:
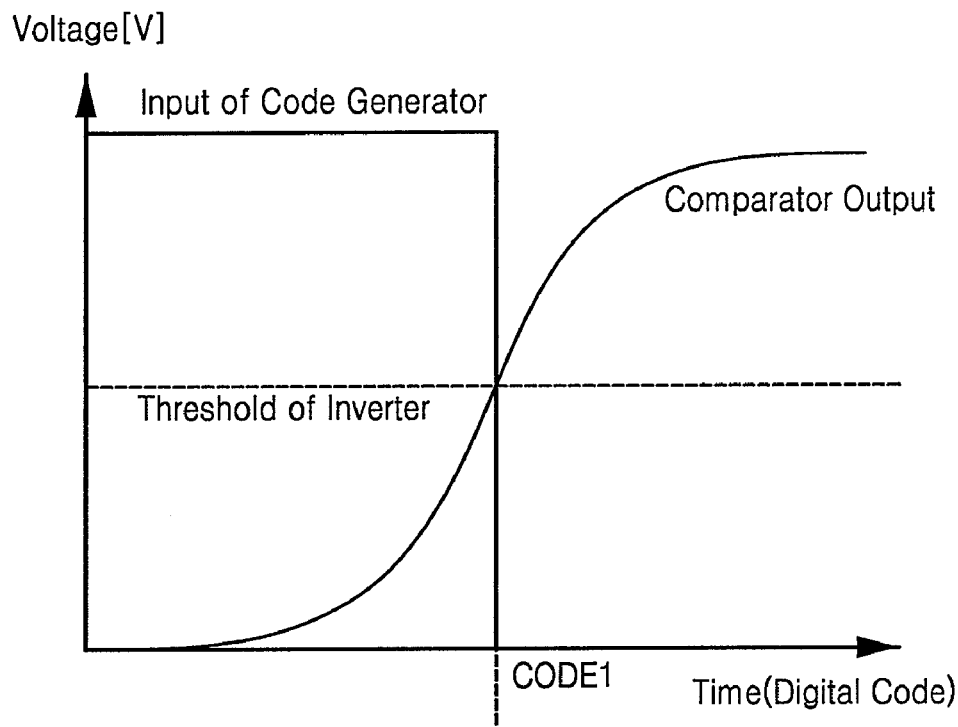
FIG. 5A and FIG. 5B illustrate waveforms of an output signal of a comparator and an input signal of a code generator in the single slope ADC illustrated in FIG. 4.

Similar to what was shown in FIG. 2A, FIG. 5A illustrates waveforms of an ideal output signal of the first comparator 22, or an output signal of the first comparator 22 that does not include any noise at all, and an output signal of the second comparator 24, which is the input signal of the code generator 30. In this exemplary embodiment, the code generator 30 can output a digital code CODE1 exactly indicating a time-point when a voltage level of the input signal INPUT and a voltage level of the ramp signal RAMP become the same.

Figure 5B:
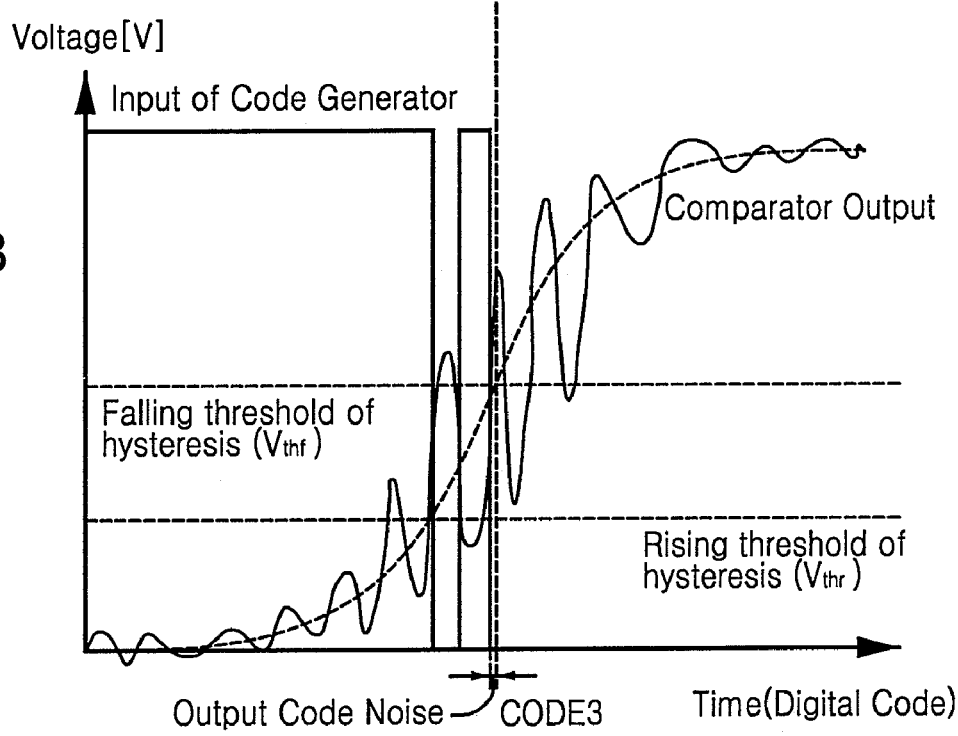

FIG. 5B, however, illustrates waveforms of an output signal of the first comparator 22 including noise, and an output signal of the second comparator 24 that is the input signal of the code generator 30, that an effect of the noise is considerably eliminated by the hysteresis of the second comparator 24.

The first comparator 22 compares a voltage level of the input signal INPUT and that of the ramp signal RAMP, which is ramping, and then outputs a comparison result. As soon as the ramp signal RAMP starts ramping, or just after starting ramping, the counter 28 starts counting in response to an activated enable signal EN and the clock signal CLK.

The enable signal EN can be generated by a predetermined detector (not shown) that can detect a ramping time-point of the ramp signal RAMP. Also, the predetermined detector (not shown) can generate the enable signal EN based on the ramping time-point of the ramp signal RAMP and a state, for example, a high level, of the output signal of the second comparator 24.

Also, according to exemplary embodiments of the present invention, the counter 28 detects the enable signal EN output from a certain detector (not shown), that can detect the ramping time-point of the ramp signal RAMP and a logic level, for example, a high level, of the output signal of the second comparator 24 separately (or independently) input to the counter 28, and can start counting based on the detected logic level.

In the case of the output signal of the first comparator 22 having a first state, the second comparator 24 outputs an output signal having a second state. Accordingly, the counter 28 continues counting in response to the clock signal CLK.

When the level of the output signal of the first comparator 22 becomes higher than a falling threshold Vthf as the voltage level of the ramp signal RAMP increases, the output signal of the second comparator 24 is transited from the second state to the first state. In this case, the counter 28 stops counting and keeps its count value of just prior to the transition.

When the output signal of the first comparator 22 is lower than a rising threshold Vthr of the second comparator 24 by the effect of noise, the output signal of the second comparator 24 is re-transited from the first state to the second state. In this case, the counter 28 proceeds with counting.

When the level of the output signal of the first comparator 22 becomes lower than the failing threshold Vthf of the second comparator 24 due to the effect of noise, the output signal of the second comparator 24 transits once again from the second state to the first state. In this case, the counter 28 stops counting and keeps the count value it had just prior to the transition. At this time, the code generator 30 outputs an n-bit digital value from the counter 28, which stops counting, as a digital code CODE3. The output code noise is represented by the time difference between digital code CODE3 and digital code CODE1.

Referring to FIGS. 1 and 2, because an inverter 14 having only one threshold transits a state every time that an output signal of a comparator 12 passes through the threshold, a transition of a state of the output signal of the inverter 14 operates as noise of a code generator 16.

Referring to FIGS. 3 and 5B, however, after one transition of a state of an output signal of a second comparator 24 having two thresholds Vthr and Vthf, in a case that a change of an input signal input to the second comparator 24 caused by noise is smaller than a difference between the two thresholds Vthr and Vthf, the state of the output signal of the second comparator 24 is maintained as it is and noisy transitions are minimized. Accordingly, the second comparator 24 can have the effect of suppressing noise included in a signal inputted to the code generating unit 26.

Figure 2B:
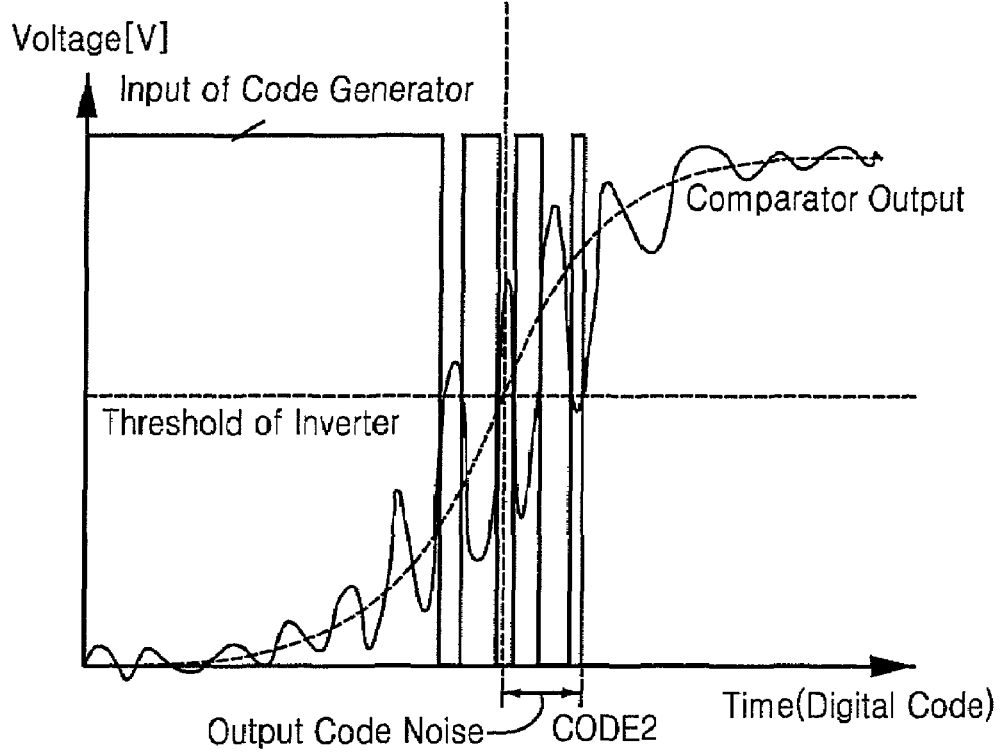

As shown in FIGS. 2B and 5B, the single slope ADC 200 according to an exemplary embodiment of the present invention can considerably reduce output code noise.

As shown in FIG. 3, the single slope ADC 200 can further include a controller 32, which can output at least one of a first control signal CTRL1 or a second control signal CTRL2. The first control signal CTRL1 is intended to control the falling threshold Vthf of the second comparator 24 by responding to a control signal CTRL fed thereto, and the second control signal CTRL2 is intended to control the rising threshold Vthr of the second comparator 24.

In the case that at least one of the falling threshold Vthf and the rising threshold Vthr of the second comparator 24 is controlled, eliminating noises included in an input signal input to the code generator 26, which is an output signal of the second comparator 24, can be optimized.

FIGS. 3 to 5B are provided for convenience in explaining the single slope ADC having a hysteresis property according to exemplary embodiments of the present invention, and respective changes of the waveforms, for example, phase changes illustrated in FIGS. 5A and 5B can be easily understood by a person having an ordinary skill in the art based on the matters illustrated in FIGS. 3 to 5B, provided with the following cases: a case of downward ramping by the ramp signal RAMP; a case that the ramp signal RAMP is input to a first input terminal, for example, (−) input terminal, of the first comparator 22; the case of an exemplary embodiment of the second comparator 24 as the Schmidt trigger; and a case that a code generator 30 is embodied as a volatile memory, such as an SRAM.

As described above, according to exemplary embodiments of the present invention, noise input to a code generator can be reduced by a single slope analog to digital converter having a hysteresis property. An analog to digital converting method is also provided. Further, there is also the effect that output code noise output from the single slope analog to digital converter can be reduced.

According to exemplary embodiments of the present inventions, a CMOS image sensor including the single slope analog to digital converter having a hysteresis property can reduce output code noise output from the single slope analog to digital converter. Accordingly, because the CMOS image sensor is insensitive to noise, a capacity of the CMOS image sensor can be improved.

While the present invention has been particularly shown and described with reference to exemplary embodiments thereof, it will be understood by those of ordinary skill in the art that various changes in form and detail may be made herein without departing from the spirit and scope of the present invention, as defined by the following claims.

What is claimed is:

1. A single slope analog to digital converter comprising:
    a first comparator that outputs a compared signal by receiving and comparing an input signal having a constant level with a ramp signal;
    a second comparator that has a hysteresis property having an input terminal connected to an output terminal of the first comparator; and
    a code generating unit that is connected to an output of the second comparator and outputs a digital code corresponding to a time-point of a state transition of the output signal of the second comparator,
    wherein the second comparator has a rising threshold and a falling threshold, and a state of an output signal of the second comparator is maintained when a change of an input signal input to the second comparator caused by noise is smaller than a difference between the rising threshold and the falling threshold.

2. The single slope analog to digital converter of claim 1, wherein the second comparator is a Schmidt trigger.

3. The single slope analog to digital converter of claim 2, further comprising a controller that controls at least one of the rising threshold and the falling threshold of the Schmidt trigger.

4. The single slope analog to digital converter of claim 1, wherein the second comparator is a Schmidt-trigger inverter.

5. The single slope analog to digital converter of claim 4, further comprising a controller that controls at least one of the rising threshold and the falling threshold of the Schmidt-trigger inverter.

6. The single slope analog to digital converter of claim 1, wherein the code generating unit comprises:
    a counter that outputs a digital count value in response to a clock signal; and
    a code generator that outputs the digital count value as the digital code from a time-point of a state transition of the output signal of the second comparator in response to the output signal of the second comparator and the digital count value of the counter.

7. The single slope analog to digital converter of claim 1, wherein the code generating unit comprises:
    a counter that outputs a digital count value in response to a clock signal; and
    a memory that receives the output signal of the second comparator and the digital count value, and latches the digital count value when a state of the output signal of the second comparator is changed.

8. A CMOS image sensor comprising a single slope analog to digital converter, wherein the single slope analog to digital converter comprises:
    a first comparator that outputs a compared signal by receiving and comparing an input signal having a constant level with a ramp signal;
    a second comparator that has a hysteresis property having an input terminal connected to an output terminal of the first comparator; and
    a code generating unit that is connected to an output of the second comparator and outputs a digital code corresponding to a time-point of a state transition of the output signal of the second comparator,
    wherein the second comparator has a rising threshold and a falling threshold, and a state of an output signal of the second comparator is maintained when a change of an input signal input to the second comparator caused by noise is smaller than a difference between the rising threshold and a falling threshold.

9. A single slope analog to digital converting method comprising:
    outputting a first compared signal by receiving and comparing an input signal having a constant level with a ramp signal;
    outputting a second compared signal by comparing the first compared signal using a hysteresis property; and
    receiving a digital count value, which is successively changed, and the second compared signal, and outputting a digital code corresponding to the digital count value of a time-point of a state transition of the second compared signal.

10. The single slope analog to digital converting method of claim 9, wherein the step of outputting the second compared signal comprises outputting the second compared signal by comparing the first compared signal using one of a Schmidt trigger and a Schmidt-trigger inverter.

11. The single slope analog to digital converting method of claim 10, wherein the step of outputting the second compared signal comprises outputting the second compared signal by comparing the first compared signal using the Schmidt trigger so that at least one of a rising threshold and a falling threshold is controlled.

12. The single slope analog to digital converting method of claim 10, wherein the step of outputting the second compared signal comprises outputting the second compared signal by comparing the first compared signal using the Schmidt-trigger inverter so that at least one of a rising threshold and a falling threshold is controlled.

13. The single slope analog to digital converting method of claim 9, wherein the step of outputting the digital code comprises:
    generating the digital count value by responding to a clock signal; and
    receiving the second compared signal and the digital count value, and outputting the digital code corresponding to the digital count value of a time-point of a state transition of the second compared signal.

* * * * *